United States Patent [19]

Nagano

[11] 4,262,259
[45] Apr. 14, 1981

[54] LOW CURRENT LINEARIZATION OF MAGNETIC AMPLIFIER FOR DC TRANSDUCER

[76] Inventor: Robert A. Frosch, Administrator of the National Aeronautics and Space Administration, with respect to an invention of Satoshi Nagano, Long Beach, Calif.

[21] Appl. No.: 51,269

[22] Filed: Jun. 22, 1979

[51] Int. Cl.³ .............................................. H03F 9/00
[52] U.S. Cl. ............................................................ 330/8
[58] Field of Search ............................ 330/8; 307/314

[56] References Cited

U.S. PATENT DOCUMENTS 2,892,155   6/1959   Radus et al. ......................... 324/117

Primary Examiner—James B. Mullins
Attorney, Agent, or Firm—Monte F. Mott; John R. Manning; Paul F. McCaul

[57] ABSTRACT

A magnetic amplifier having two saturable reactor cores with a separate excitation winding on each connected in series opposition, a common control winding and a common output winding, is adapted for use as a low level signal transducer by exciting the separate excitation windings in push-pull mode through a center tapped transformer, and including at least one diode in series with a load resistor connected to the output winding. A resistor in series with the output winding and load resistor is connected between the center tap of the excitation transformer and the connection between the two excitation windings of the saturable cores. This series resistor provides a return current path for the output winding and allows the excitation windings of the saturable cores to operate as primary windings of transformers.

6 Claims, 4 Drawing Figures

4,262,259

LOW CURRENT LINEARIZATION OF MAGNETIC AMPLIFIER FOR DC TRANSDUCER

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 USC 2457).

BACKGROUND OF THE INVENTION

This invention relates to magnetic amplifiers, and more particularly to a low level DC transducer which operates on magnetic amplifier principles.

Magnetic amplifiers are ideally suited to the task of amplifying very low DC signals since a small current in a control winding can have a large effect in the load current. One application for such a very low level amplifier is monitoring strategic points in complex systems, such as power conditioning systems of spacecraft for the purpose of effecting judicious management of power.

Measurement of DC current flow in a circuit usually requires insertion of a DC meter in series with the source and load. In applications involving high voltages this may be undesirable because of the lack of isolation. In other instances, power wasting meter shunt-resistors may be needed. These disadvantages can be avoided by use of the so-called "DC transformer" arrangement which operates on magnetic amplifier principles. Instead of the classic arrangement in which a small DC current controls the flow of a large amount of AC power, a constant amplitude, fixed frequency AC excitation is applied to one winding of a transformer having a core which exhibits a desired saturation characteristic. The DC current flow which is being monitored is fed into another winding of the transformer to produce a magnetic core flux which varies in accordance with the DC current flow. Since circuit reactance is a function of the degree of saturation of the core produced by the DC current flow, the output of the transformer (usually rectified for use by a DC meter) indicates the DC current flow, which sometimes may be at a very low level.

Magnetic amplifiers used as DC current transducers heretofore have been relatively bulky and heavy. As a consequence, their use has been restricted to a relatively small number of observation points in the power conditioning system of space craft. Transducers on recent spacecraft weighed 100 grams. That weight has been reduced to 60 grams, and more recent effort has further reduced that weight to only 4 grams. Such a great reduction in weight will permit more extensive use on spacecraft, and in other applications as well since bulk and weight are significant factors even in commercial applications.

With the possibility of being able to monitor currents at more points in a system, it becomes desirable to monitor points which normally experience very low currents of less than 0.1 ampere. The circuit designs for transducers of larger DC currents have presented no problem in the miniaturizing program. This is because magnetic amplifiers used as DC current transducers easily exhibit a relatively linear transfer function in the large current region. There is a region below 0.1 ampere in which the transducer exhibits a large inverse function, i.e., a transfer function in which the output increases at a high rate as the DC input current decreases at lower rate. Consequently, a conventional magnetic amplifier circuit can not be used for monitoring such low DC currents. What is needed is a circuit design which exhibits a substantially linear transfer function from relatively high DC currents of about 0.5 amperes down below 0.1 amperes to no DC current.

SUMMARY OF THE INVENTION

In accordance with the present invention, a magnetic amplifier of the type in which direct current in one winding of a saturable core reactor controls the flow of a large amount of power is adapted for use as a DC transducer by applying a constant amplitude, fixed frequency AC excitation to the AC winding while the DC current being monitored is applied to the control winding to produce a magnetic core flux which varies in accordance with the level of current in the control winding. Current in a third winding then indicates the level of direct current in the control winding. Such a magnetic amplifier is quite linear, except at very low current levels. To effect linearization of the low current characteristic of the magnetic amplifier, at least one diode is connected in series with the output winding. While such an improvement is intended primarily for use of the magnetic amplifier as a DC transducer, it is evident that such an improved magnetic amplifier may be used to advantage for other purposes.

The novel features of the invention are set forth with particularity in the appended claims. The invention will best be understood from the following description when read in conjunction with the accompanying drawings.

DESCRIPTION OF PREFERRED EMBODIMENTS

Figure 1:
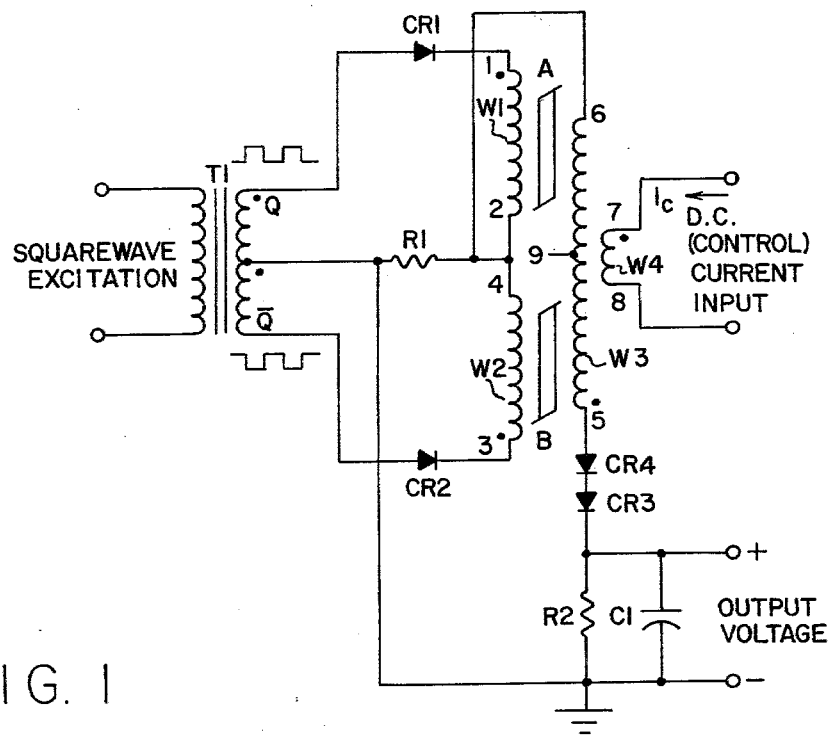
FIG. 1 is a circuit diagram of a conventional magnetic amplifier circuit which embodies the improvement of the present invention.

Referring now to the drawings, FIG. 1 illustrates a conventional magnetic amplifier comprised of a transformer T1 and two saturable reactors, A and B, each having a separate excitation (primary) winding, one winding W1 between terminals 1 and 2 on core A, and one winding W2 between terminals 3 and 4 on core B, and an output (secondary) winding W3 common to both cores between terminals 5 and 6. A DC control winding W4, also common to both cores, is provided between terminals 7 and 8. When the excitation windings W1 and W2 are alternately driven by a square wave signal of constant amplitude and fixed frequency via a transformer T1 having a center tap on its secondary winding connected to terminals 2 and 4 through a resistor R1, unidirectional current pulses are induced in the output winding W3 with an amplitude proportional to direct current in the control winding W4. These pulses may be integrated in an output capacitor C1 across a current limiting resistor R2 in series with the output winding W3 to provide a DC signal that is linearly proportional to the control current in the winding W4.

Figure 2:
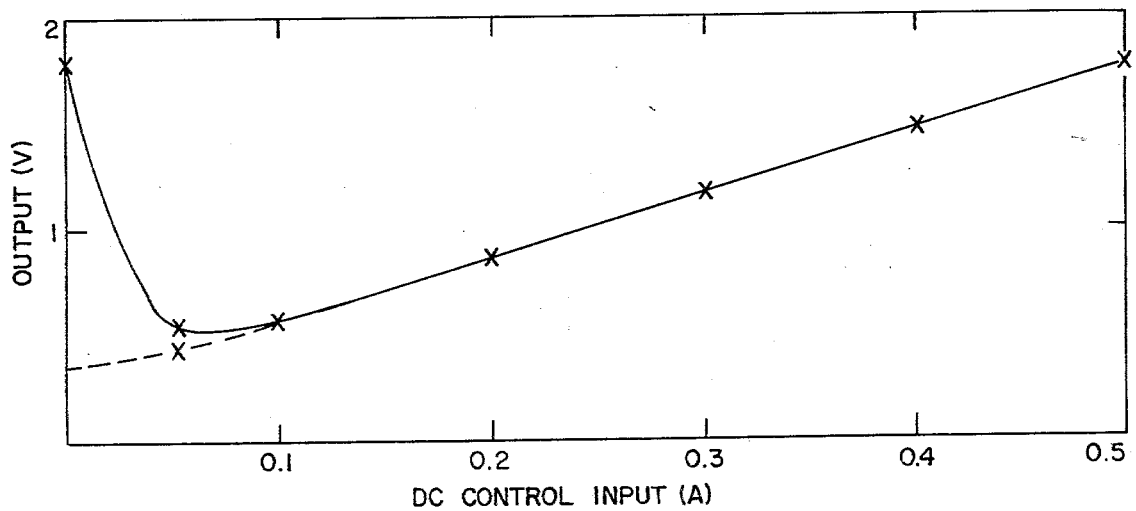
FIG. 2 is a graph showing the nonlinear region of the conventional magnetic amplifier illustrated schematically in FIG. 1 at very low control current levels without the improvement of the present invention and (in dotted line) with the improvement.

Such a conventional magnetic amplifier so far described exhibits a relatively linear transfer function in the large current region above 0.1 amperes, as shown in FIG. 2. Below that region, from about 0.05 to 0.1, amperes the slope of the amplifier characteristic decreases, and below that, from 0 to about 0.05 amperes, the slope becomes negative and becomes very large, even larger than the positive slope from 0.1 amperes and above. As a consequence, a small decrease in current from 0.1 to about 0.05 amperes will yield an almost imperceptible change in the output voltage, and any further decrease will yield a large increase in the output voltage as though current were increasing from 0.1 to 0.5 amperes. It has been found that utilization of a voltage (IR) drop across one or two diodes CR3 and CR4 in series with the output winding W3 effects linearization of the very low (0 to 0.05 amperes) current characteristic of the magnetic amplifier, which is of particular advantage for use of the magnetic amplifier as a low level current transducer. It also prevents the possibility of reverse saturation of the cores during resetting and makes possible a better compromise on the value of the current limiting resistor R2. The number of diodes to be included in series with the resistor R2 will depend largely on the characteristics of the diodes selected. The proper selection and the number to be used can be determined empirically for any particular magnetic amplifier circuit.

Figure 3:
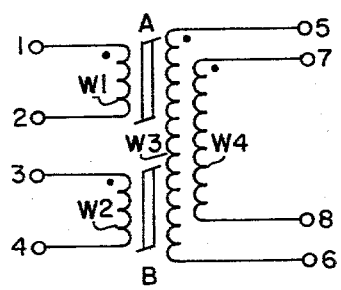
FIG. 3 illustrates schematically the windings of the saturable reactor core of FIG. 1.
Figure 4:
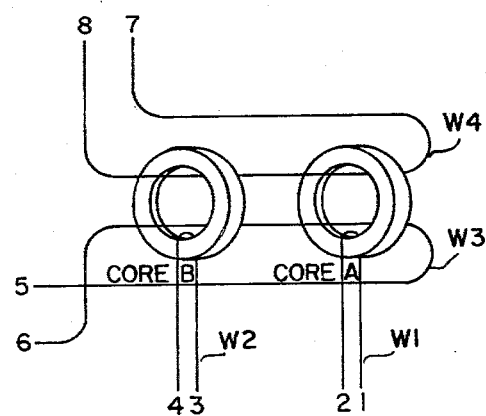
FIG. 4 illustrates isometrically the saturable reactor cores with the windings simplified as single-turn windings to better illustrate their relationship to each other as wound on the cores.

FIGS. 3 and 4 are schematics showing the dual cores and various windings of the saturable reactor cores used. The cores have a special saturation characteristic selected for the purpose, as is well known in the art of magnetic amplifiers. The two excitation windings W1 and W2 are wound separately on the two cores, with the windings connected together at terminals 2 and 4 in series opposition. A winding W4, usually termed the control current winding, introduces the DC signal which is to be monitored. Turns of the winding W4 pass through both cores, as indicated. The single output winding W3 is wound about both cores and for the purpose of the following discussion has an imaginary center tap 9 shown in FIG. 1. Windings W1 and half the winding W3 between terminals 6 and 9 on the upper core A constitute one section of the saturable reactor, and winding W1 and half the winding W3 between terminals 5 and 9 on the lower core B constitute a second section. The squarewave excitation source operates at 10 kHz to produce Q and $\bar{Q}$ phases for driving the first and second sections sequentially, furnishing an excitation current which passes through steering diode CR1 or CR2 to set (drive toward saturation) the respective cores A and B.

The instantaneous magnitude of the DC signal which is being monitored determines the magnetic flux about the conductor making up winding W4 and thus establishes a level of magnetization in the cores. The excitation provided during the Q and $\bar{Q}$ phases, adds to this initial level of magnetization. The impedances of the windings of the two sections thus vary over each half cycle. The impedance is large during the first portion (the set phase) of each half-cycle but decrease to a small value during the remainder (the saturated phase) of the half-cycle when the core goes into saturation. Although the excitation is of constant amplitude, the current flow produced thereby, and which appears across the output terminals, varies as the impedance of the windings is changed by the varying flux produced by variations in the DC (control) signal input. As the DC signal increases, the impedance of the windings decreases, the level of the current produced by the excitation increases and the output shows a higher value, and vice versa. The output voltage is taken across the resistor R2 bypassed by the filter capacitor C1 which is ignored in the discussion that follows. The role of resistor R1 will be described more fully hereinafter. For the present consider that it merely functions as a current limiter in the return current path.

As noted hereinbefore, the present invention consists of the insertion of diodes CR3 and CR4 between the output winding W3 and resistor R2. Understanding of the effect of the diode on the improved linearity in the very low region of the amplifier will be facilitated by review of circuit operation without it.

The magnetic amplifier has the properties of a current transformer in that the amplitude of the current flowing in winding W1 is equal to the amplitude of the DC current being monitored and which flows in winding W4, divided by the ratio of the turns of windings W3 to winding W4. During each respective Q and $\bar{Q}$ switching half-cycle of the AC squarewave excitation applied sequentially to windings W1 and W2, the cores A and B each have two distinct operating phases, an unsaturated phase and a saturated one. Operation for each half-cycle being the same, consider what happens when a half-cycle is applied to winding W1 through diode CR1. (Since diode CR2 is then off, winding W2 is inoperative during this half-cycle). During the first phase, the excitation current flowing in winding W1 is transferred by transformer action to the upper half of the winding W3 between terminals 6 and 9 to set (drive toward saturation) core A. During the second phase, when core A is saturated, the impedance of these windings are significantly reduced.

When the next $\bar{Q}$ half-cycle excitation turns diode CR2 on, winding W2 and the lower half of the winding W3 experience the same set and saturation phases, but current flow through winding W3 is in the opposite direction, developing a voltage which acts to reset (bias in the opposite direction to produce desaturation) the core A. This restores normal impedance to the upper half of the winding W3.

It is basic to operation of the magnetic amplifier in the switching mode that the voltage appearing across one primary winding, such as W1, to produce saturation, and the voltage of opposite polarity which appears across its secondary winding between terminals 6–9, to effect desaturation, must be of the same amplitude. Hence the voltage which effects reset for each of the cores in turn must not be allowed to reach a level which would over bias either core to produce saturation in the wrong direction. If this should occur with either core, both cores would thereafter remain saturated, defeating the desired switching action.

The role of the resistor R1 may be better understood by considering that if the resistor R1 were omitted, winding W1 and W2 during their respective operating half-cycles would operate as simple inductors rather than as the primary windings of the transformers. There then would be no transfer of reverse polarity for effecting reset. Instead, since their impedance as inductors would then be in series with that of winding W3, the current flow would produce the same voltage polarity on each half-cycle. When each core becomes saturated, the core would remain in that state because the reverse voltage polarity needed for desaturation would not be developed. Resistor R1 is thus used to provide the desired transformer action and must have a sufficient ohmic value to ensure the desired operation. On the other hand it must not be so large that sufficient magnetizing and desaturating current cannot flow because of the voltage drop across it. Resistor R1 provides a path for the induced load current through winding W3 and also for the magnetizing current during the first phase, but it serves no function during the second phase and dissipates power. Consequently the value of the resistor R1 must be a compromise, small enough to provide the return path for the magnetizing current instead of the alternate path through winding W3, yet large enough to minimize power loss. Since resistor R2 must be fixed by the desired voltage indicating range for the expected DC current flow, choosing an appropriate value for resistor R1 through which the same current circulates becomes somewhat of a problem.

The use of the diode drop (depending upon the number of diodes) in series with resistors R2 and R1 has a three-fold effect. It limits the indicating voltage which appears across resistor R2 to provide the output indication, and with an appropriate selection of diode drop, effects the desired linearization in the low level region. The diode drop is also beneficial in that it limits the voltage for resetting the cores and thus lessens the possibility of over biasing in the wrong direction which could produce reverse saturation. And finally it makes possible a more satisfactory compromise in arriving at the value of resistor R1. After the value of resistor R1 is determined, the number of diodes used in series to produce the desired diode drop is determined experimentally. The use of the diode drop makes possible an improved arrangement which is capable of producing the desired linear response in the low level region. This improvement is indicated in dashed line in FIG. 2 from 0 to 0.1. The curve is for a one ampere transducer but the arrangement can be used for measuring smaller currents by merely changing the number of turns used for winding W4 as indicated in the following table.

| AMPS | TURNS |
|------|-------|
| 1    | 1     |
| 0.5  | 2     |
| 0.2  | 5     |
| 0.1  | 10    |

In an exemplary embodiment, using IN916 diodes, two diodes were used with a value of 2.7 kohms for resistor R2 and 5 kohms for resistor R1.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. In a magnetic amplifier of the type in which direct current in a control winding of a saturable transformer having two saturable reactor cores controls the flow of a large amount of power in an output winding common to both cores, each core having a separate excitation winding, said excitation windings being driven in a push-pull mode by an AC signal of constant amplitude and frequency, the improvement of a diode in series with a load connected to said output winding to improve the linearity of its control versus output characteristics at very low current levels in said control winding, thereby to adapt said magnetic amplifier for use as a low level current transducer.

2. The improvement of claim 1 wherein said load is comprised of a resistor and a filter capacitor in parallel with said resistor.

3. The improvement of claim 1 or 2 wherein at least two diodes are connected in series with said load.

4. In a magnetic amplifier having two saturable reactor cores with a separate excitation winding on each connected in series opposition for alternate excitation in the manner of a push-pull output transformer, a common output winding on said cores, and a common control winding on said cores for receiving a low level signal to control the power transformer from said excitation windings to said output winding, the improvement comprising at least one diode in series with load impedance connected to said output winding thereby to improve the linearity of the output signal as a function of said low level signal at very low signal levels with an alternating excitation signal applied out of phase to said excitation windings with a constant amplitude and phase.

5. The combination of claim 4 wherein said alternating excitation signal is applied out of phase to said excitation winding through a drive transformer having a primary winding and a center tapped secondary winding, a resistor connecting the center tap of said secondary winding to a terminal between said excitation windings, a diode connecting one end of said secondary winding to one end of one excitation winding remote from said terminal, a connection of one end of said output winding to said terminal and a connection of said center tap of said secondary winding to a return current path for current flow through said output winding and load impedance.

6. The combination of claim 5 wherein said load impedance is comprised of a resistor and a filter capacitor in parallel with said load resistor.

* * * * *